*(12)* United States Patent
Fujita et al.

(10) Patent No.: US 6,301,143 B1
(45) Date of Patent: Oct. 9, 2001

(54) SEMICONDUCTOR MEMORY DEVICE WITH CHIP LAYOUT FOR ENABLING HIGH SPEED OPERATION

(75) Inventors: Norihiro Fujita, Fujisawa; Masami Masuda, Yokohama, both of (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/645,552

(22) Filed: Aug. 25, 2000

(30) Foreign Application Priority Data

Aug. 27, 1999 (JP) .................................................. 11-242205

(51) Int. Cl.[7] ................................. G11C 5/06; G11C 5/02
(52) U.S. Cl. ................................................. 365/63; 365/51
(58) Field of Search ........................... 365/51, 63, 230.03, 365/52

(56) References Cited

U.S. PATENT DOCUMENTS 5,604,710 * 2/1997 Tomishima et al. ............ 365/230.03
5,812,490 * 9/1998 Tsukude .............................. 365/233
5,815,454 * 9/1998 Tomishima et al. .................. 365/226
6,088,252 * 7/2000 Fujisawa et al. ....................... 365/51

FOREIGN PATENT DOCUMENTS

| 8-212774 | 8/1996 | (JP) . |
| 10-241363 | 9/1998 | (JP) . |
| 10-256512 | 9/1998 | (JP) . |
| 11-86531 | 3/1999 | (JP) . |

* cited by examiner

*Primary Examiner*—Son Mai
(74) *Attorney, Agent, or Firm*—Finnegan, Henderson, Farabow, Garrett & Dunner, L.L.P.

(57) ABSTRACT

In an enabling high-speed operation memory cell chip, its cell array is divided, for example, into 4 cell blocks, the first two being arranged side by side, while the second two being arranged side by side under the first two. The row decoder groups are each arranged between the cell blocks provided in row direction. The column decoder groups and the sense amplifier groups are respectively arranged between the cell blocks provided in column direction. Further, the peripheral circuit area is provided between the cell blocks provided in column direction so that the predecoder groups, address input circuit groups and data input/output circuit groups are arranged in line therein.

20 Claims, 13 Drawing Sheets

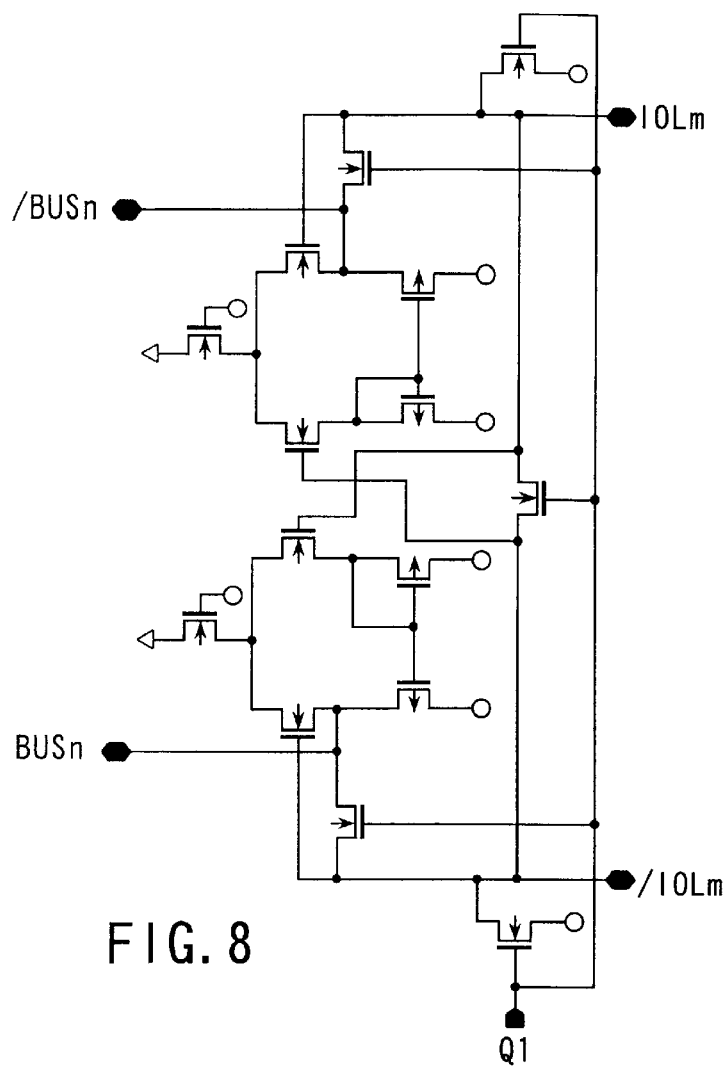
FIG. 8
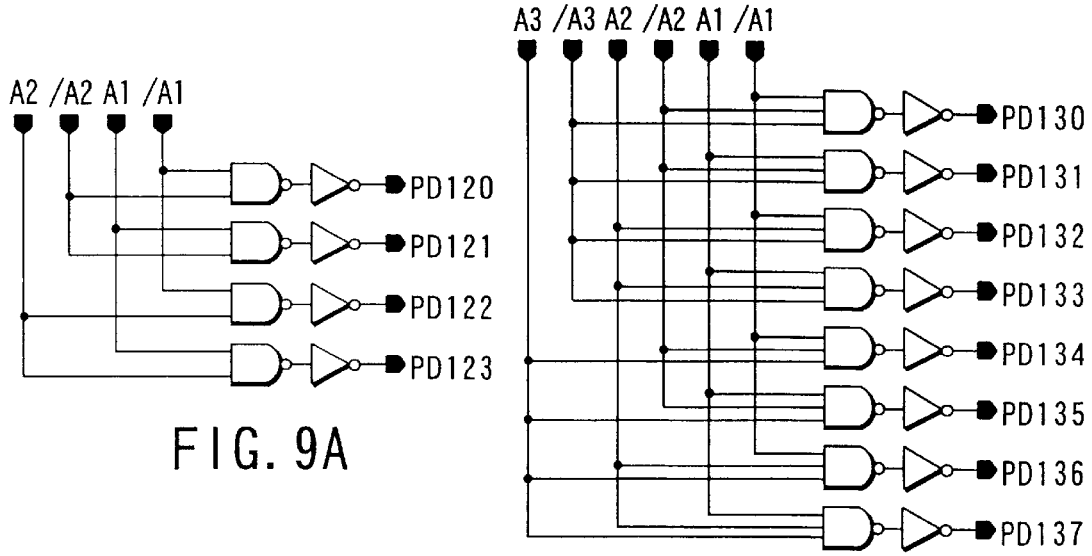
FIG. 9A
FIG. 9B

SEMICONDUCTOR MEMORY DEVICE WITH CHIP LAYOUT FOR ENABLING HIGH SPEED OPERATION

CROSS-REFERENCE TO RELATED APPLICATIONS

This application is based upon and claims the benefit of priority from the prior Japanese Patent Application No. 11-242205, filed Aug. 27, 1999, the entire contents of which are incorporated herein by reference.

BACKGROUND OF THE INVENTION

The present invention relates to a semiconductor memory device with chip layout for enabling high-speed operation. More particularly, the present invention relates to the chip layout of a memory cell chip comprising a plurality of address input circuits, each address input circuit accepting a plurality of address inputs and outputting a complementary signal corresponding to each address input, and a plurality of predecoders, each predecoder outputting selects signal corresponding to the combination of the complementary signals for each two or more address input circuits.

Recently, the development of large-capacity and high-speed memory cell chips has progressed rapidly. The access speed of the memory cell chip is required to be maintained or even to be increased when the capacity of the memory cell chip is increased by 2 or 4 times.

In general, increasing the capacity of the memory cell chip by 4 times entails the increase in the area of the chip by 2 and 3 times. Further, the length of each side of the chip also increases by 1.4 to 2 times. The increase in the chip size resulting from the increase in its capacity entails the elongation of wiring. The elongation of wiring results in the increase in wiring capacity and wiring resistance. These things are now the major drawback to the realization of high-speed operation the memory cell chip.

In general, the access speed is dependent on the time period required from the change of address to the output of the data. That is, the time period during which the address changes to cause the actuation of the address input circuit, establishment of the decoder, selection of one of the cells, amplification of the potential of bit line leading to the cell by the sense amplifier and output of the data of the cell from the data output buffer after passing bus line and the data output circuit.

FIG. 1 schematically illustrates the chip layout of a conventional memory cell chip.

The memory cell chip 100 is divided into 4 cell blocks 101, a pair being arranged horizontally and another horizontally arranged pair coming under the other pair. Row decoder groups 102 are placed between the cell block 101 on the left and the cell block 101 on the right. Column decoder groups 103 and sense amplifier groups 104 are placed between the upper cell block 101 and lower cell block 101 respectively. Further, a pulse synthesizing circuit 105 is provided substantially at the center of the memory cell chip 100. Further, address input circuit groups 106, predecoder groups 107, control pin input circuit 108, data input/output circuit groups 109, data output buffer 110 and a plurality of pads 111 are provided respectively in the peripheral area of the memory cell chip 100. The data input/output circuit groups 109 each comprise a data input circuit and a data output circuit. A plurality of the pads 111 are IO (Input/Output) pads and power source pads.

However, in the case of the previously mentioned conventional layout, the address input circuit groups 106 are provided in the peripheral area of the chip 100. Therefore, the distances between some of the address input circuit groups 106 and some of the predecoder groups 107 are relatively large.

FIG. 2 shows an example of wiring of the chip 100. The figure especially shows wiring 112a-1 connecting address input circuit group 106a and the predecoder group 107a and wiring 112b-1 connecting address input circuit group 106b and predecoder group 107b. Further, the figure shows wiring 112a-2 and wiring 112b-2, respectively ranging from each of the address input circuit for the input of the row address and the address input circuit for the input of the column address to the row decoder and column decoder by way of the predecoder.

In the case of the conventional layout, concerning the row address, wiring 112a-1 (LR1) from the address input circuit group 106a to the predecoder group 107a is relatively long. Further, wiring 112a-2 (LR2) connecting the predecoder group 107a and each of the row decoder groups 102a and 102b is too long. On the other hand, concerning the column address, wiring 112b-1 (LC1) from the address input circuit group 106b to the predecoder group 107b is relatively short. In contrast, wiring 112b-2 (LC2) connecting the predecoder group 107b and column decoder groups 103b and 103d is too long. Therefore, the output signal from the address input circuit group 106a and the output signals from the predecoder groups 107a and 107b are largely affected by the wiring capacity and wiring resistance. This has been a major factor causing a longer time required for the establishment of the decoder and the resultant slow access speed.

Further, similar problem has been encountered as to the pulse signal generated according to the change of address. FIG. 3 shows an example of another wiring for the chip. The figure shows wirings 113a and 113b respectively connecting between the address input circuit group 106a and pulse synthesizing circuit 105 and between the address input circuit group 106b and the pulse synthesizing circuit 105.

The pulse signals generated in the address input circuit groups 106a and 106b respectively are supplied to the pulse synthesizing circuit 105 respectively through wirings 113a and 113b respectively to be used for the formation of pulse synthesizing signal in the pulse synthesizing circuit 105.

The address input circuit groups 106a and 106b are provided in the peripheral area of the chip 100, while the pulse synthesizing circuit 105 is provided substantially at the center of the chip 100. In consequence, the distance from each of the address input circuit groups 106a and 106b to the pulse synthesizing circuit 105 is too large. In this case, the length of wiring 113a (length: LQ1+LQ3) between the address input circuit group 106a and the pulse synthesizing circuit 105 and the length of wiring 113b (length: LQ2+LQ4) between the address input circuit group 106b and the pulse synthesizing circuit 105 are larger than a half of the length of the longer side of the chip 100. In consequence, the pulse signal is affected largely by the wiring capacity and wiring resistance. This has been one of the major hindrances to the quick output of the pulse synthesizing signal.

Further, in the case of the conventional layout (FIG. 1), the distance from the sense amplifier group 104 to the data output buffer 110 by way of the data input/output circuit group 109 is too large. Especially, the length of bus line 114 connecting the sense amplifier group 104 to the data input/output circuit group 109 is extremely too large.

FIG. 4 shows an example of wiring (bus line) for the chip 100, that is, bus line 114a connecting the sense amplifier group 104a to the data input/output circuit group 109a.

The length of bus line 114a, as a wiring, equals to the total of the length (LT1) passing the sense amplifier group 104a, the length (LT2) passing row decoder group 102a and the length (LT3) between the row decoder group 102a and the data input/output circuit group 109a. Consequently, the wiring capacity and wiring resistance of bus line 114a are increased. This has been one of the factors causing the delay of the activation of bus line 114a and the resultant delay of the access speed.

Further, in the case of the conventional layout, the distance between the power source pad and IO pad is too large. Consequently, the wiring resistance of power source line (not shown) increases. This has been one of the factors largely responsible for the dullness of output waveform and resultant low access speed.

As discussed in the foregoing, in the case of conventional chip layout, wiring tends to become unnecessarily long. This has been a major factor responsible for the increase in the wiring capacity and wiring resistance leading to low access speed.

BRIEF SUMMARY OF THE INVENTION

The object of the present invention is to provide a semiconductor memory device capable of reducing the length of wiring to a greatest possible extent and realizing a higher access speed.

The semiconductor memory device according to the present invention comprises a semiconductor memory device comprising: a cell array having a plurality of block areas arranged in rows and columns: row decoder groups, each group provided between two adjacent block areas of one row; column decoder groups, every two groups provided between two adjacent block areas of one column; sense amplifier groups, every two groups provided between two adjacent block areas of one column; peripheral circuit area, provided between two adjacent block areas of columns; predecoder groups, each group provided in the peripheral circuit area and located away from a center of the cell array; and address input circuit groups, each group provided in the peripheral circuit area and located near the predecoder groups.

With the arrangement described above the distance between the address input circuit to the predecoder and the distance between the predecoder to the row decoder or the column decoder can be reduced largely. In this way, the effects of wiring capacity and wiring resistance on the output signal from the address input circuit and the output signal from the predecoder can be reduced to a low level to reduce the time required from the change of address to the establishment of the decoder.

Further, the data input/output circuit groups are provided at the substantial centers of the block areas adjacent to either the upper sides and lower sides or left sides and right sides of each block area and the outside of the address input circuit groups. When arranged in this way, the distance from the sense amplifier to the data output circuit can be reduced. By doing so, the wiring capacity and the wiring resistance of bus line, ranging from the sense amplifier group to the data output buffer through the data input/output circuit group, can be suppressed to low levels so that the transmission of the signal to the data output circuit can be speeded.

Further, the power source pad is placed between input/output pads, and data output buffer is placed in the proximity to the input/output pad. When arranged in this way, the distance between power source pad and data output buffer can be reduced largely. By doing so, the dullness of the output waveform due to the wiring resistance of power source line can be reduced.

Further, pulse synthesizing circuit is placed about the center of the cell array. When arranged in this way, the distances from all the address input circuits to the pulse synthesizing circuit can be reduced largely. By doing so, the wiring capacity and wiring resistance can be reduced to low levels for speeding the generation of the pulse synthesizing signal.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 8 is a circuit diagram showing an example of the composition of a sense amplifier of the chip.

FIGS. 9A and 9B are circuit diagrams showing examples of the compositions of predecoders of the chip respectively.

DETAILED DESCRIPTION OF THE INVENTION

Figure 5:
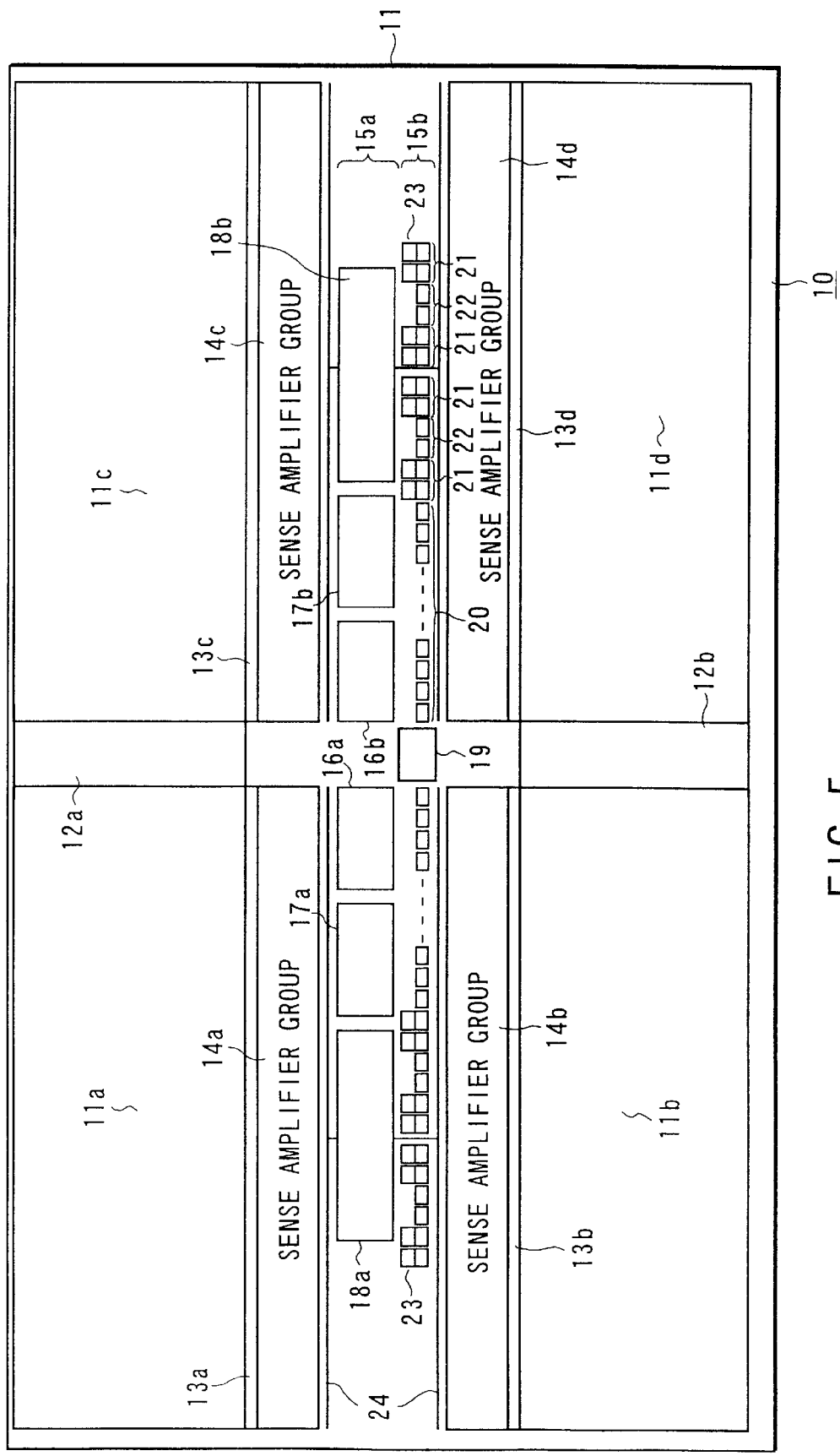
FIG. 5 is a schematic plan showing an example of the chip layout of a memory cell chip according to an embodiment of the present invention.

FIG. 5 schematically shows an example of the chip layout of a memory cell chip as an embodiment of the present invention.

In the memory cell chip 10, a cell array 11 is divided, for example, into 4 cell blocks (block areas) 11a through 11d, arranging the first two side by side and the other two side by side but under the first two. Row decoder group 12a is provided between the first horizontally arranged cell blocks 11a and 11c, while row decoder group 12b is provided between the second two cell blocks 11b and 11d.

On the other hand, the column decoder groups 13a and 13b are provided between the upper and lower cell blocks 11a and 11b and the column decoder groups 13c and 13d are provided between the upper and lower cell blocks 11c and 11d. The sense amplifier groups 14a and 14b are provided between the upper and lower cell blocks 11a and 11b and the sense amplifier groups 14c and 14d are provided between the upper and lower cell blocks 11c and 11d.

Further, peripheral circuit area 15a and pad area 15b are provided between the cell blocks 11a and 11b and between the cell blocks 11c and 11d.

Provided within the peripheral circuit area 15a are predecoder groups 16a and 16b, address input circuit groups 17a and 17b and data input/output circuit groups 18a and 18b. The predecoder groups 16a and 16b, address input circuit groups 17a and 17b and data input/output circuit groups 18a and 18b are arranged outwardly from the center of the chip 10 (or cell array 11) and in proximity to one another.

The predecoder groups 16a and 16b are interposed between the address input circuit groups 17a and 17b. More specifically, a set of the predecoder group 16a and address input circuit group 17a and a set of the predecoder group 16b and address input circuit group 17b are arranged side by side and symmetrically.

The data input/output circuit groups 18a and 18b are arranged on the outsides of the address input circuit groups 17a and 17b respectively. Further, the data input/output circuit group 18a is located substantially at the center of each of the cell blocks 11a and 11b, and the data input/output circuit group 18b is located substantially at the center of the cell blocks 11c and 11d. Each of the data input/output circuit groups 18a and 18b comprises, for example, a plurality of data input/output circuits, each comprising a data input circuit and a data output circuit.

Provided in the pad area 15b are a pulse synthesizing circuit/control pin input circuit 19 and address pads 20, IO pads 21 and power source pads (VSS, VDD) 22, which are arranged side by side.

The pulse synthesizing circuit/control pin input circuit 19 is provided substantially at the center of the chip 10 and interposed between the right and left side of the pad area 15b.

The IO pads 21 are in close proximity to data output buffer respectively.

Figure 6:
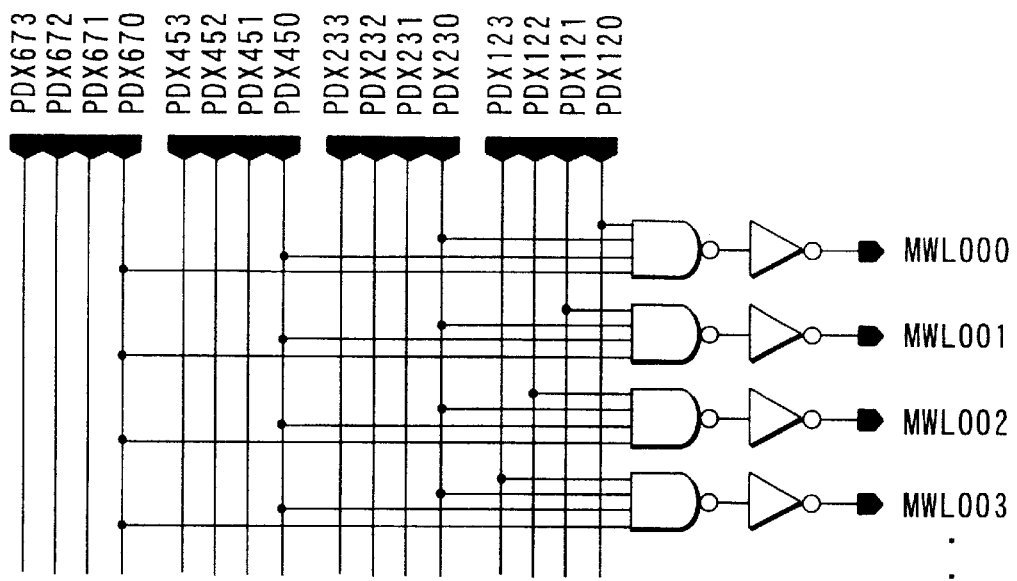
FIG. 6 is a circuit diagram showing an example of the composition of a row decoder of the chip.

FIG. 6 shows an example of a row decoder constituting the row decoder groups 12a and 12b.

This circuit, as shown in the figure, is composed by respectively connecting a plurality of NOT circuits with a plurality of NAND circuits in series. That is, the row decoder is so designed that the signals (PDX120 to PDX123, PDX230 to PDX233, PDX450 to PDX453, PDX670 to PDX673) outputted from the predecoders of row address are combined by each NAND circuit and 48 kinds of signals (MWL000 to MWL047) are output from the NOT circuits.

Figure 7:
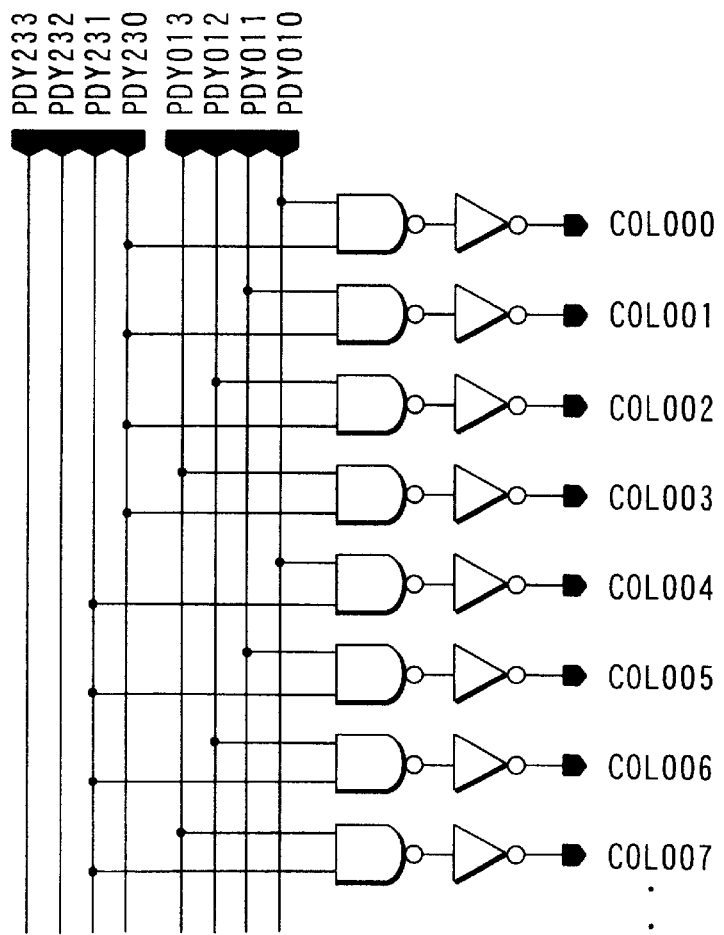
FIG. 7 is a circuit diagram showing an example of the composition of a column decoder of the chip.

FIG. 7 shows an example of a column decoder constituting the column decoder groups 13a through 13d.

This circuit, as shown in the figure, is composed by respectively connecting a plurality of NOT circuits with a plurality of NAND circuits in series. That is, this column decoder is so designed that the signals (PDY010 to PDY013, PDY230 to PDY233) outputted from the predecoder of column address are combined by each NAND circuit and 16 kinds of signals (COL000 to COL015) are output from the NOT circuits.

FIG. 8 shows an example of a sense amplifier to constitute the sense amplifier groups 14a through 14d.

This circuit, as shown in the figure, comprises a plurality of nMOS transistors and a plurality of pMOS transistors. The sense amplifier amplifies the amplitude of signal (IOLm, IOLm) of wiring connected to the IO pads 21 according to the pulse signal Q1. The sense amplifier is designed to output its amplification signal as the signal (BUSn, /BUSn) of bus line 24. Note, however, that n is the number of IO pads 21, while m is the number of wiring connected to IO pads 21.

FIGS. 9A and 9B show examples of the predecoders constituting the predecoder groups 16a and 16b respectively.

A two-address predecoder, for example comprises a plurality of NAND circuits a plurality of NOT circuits as shown in FIG. 9A. That is, the predecoder is made, by each NAND circuit, to combine the complementary signals (A1,/A1, A2, /A2) outputted from two address input circuits and outputs 4 kinds of signals (PD120 to PD123) from each NOT circuit. When two-address predecoders are used, the input signal load of the decoder can be reduced to a half compared with that in the case where the predecoders are not used.

Further, as shown in FIG. 9B, the input signal load of the decoder can be reduced to a quarter by using a three-address predecoder. The three-address predecoder is made, by each NAND circuit, to combine the complementary signals (A1, /A1, A2, /A2, A3, /A3) outputted from the three-address input circuits and output 8 kinds of signals (PD130 to PD137) from each NOT circuit.

Figure 10:
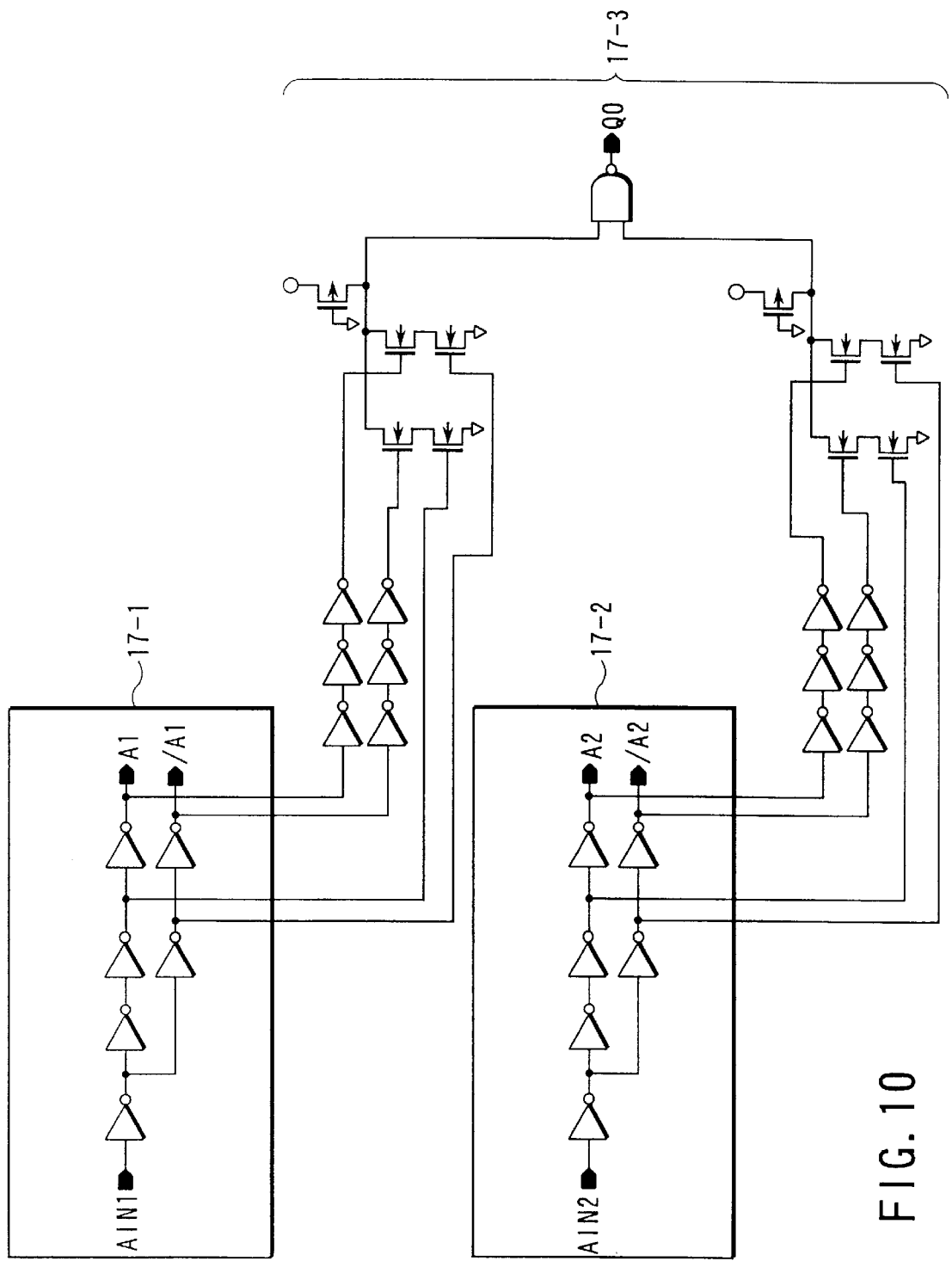
FIG. 10 is a circuit diagram showing an example of an address input circuit composition of the chip.

FIG. 10 shows an example of the address input circuit to constitute the address input circuit groups 17a and 17b.

The address input circuit, as shown in the figure, comprises two address buffers 17-1 and 17-2 and a pulse generation circuit 17-3. That is, the address input circuit is designed to output a pulse signal (Q0) when one address has been changed.

The address buffers 17-1 and 17-2 comprises a plurality of NOT circuits and outputs the signal (AINn) inputted from the address pads 20 as a complementary signal (An, /An). For instance, when AINn=VSS, An=VSS, An=VDD holds. Note, however, that n represents the numbers of the address pads 20. Normally, the address buffers are provided in number corresponding to the number of the address pads 20. Therefore, the address input circuit comprises the number of address buffers corresponding to address pads 20 (e.g., 1–6 pads) and a single pulse generation circuit.

Figure 11:
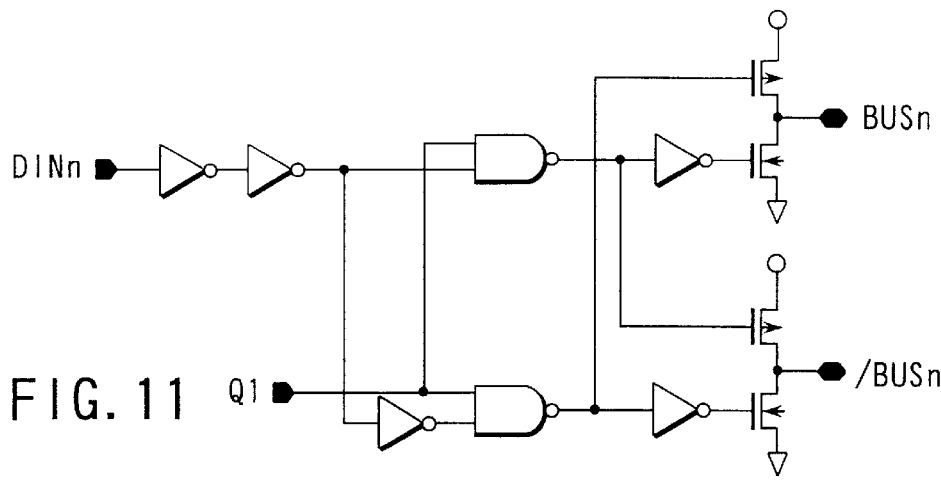
FIG. 11 is a circuit diagram showing an example of a data input circuit composition of the chip.

FIG. 11 shows an example of the data input circuit to constitute the data input/output circuit groups 18a and 18b.

This circuit is designed to input the signal (DINn) from IO pads 21 in response to the pulse signal Q1 for output as a complementary signal (BUSn, /BUSn) to bus line 24. Note that n represents the number of IO pads 21.

Figure 12:
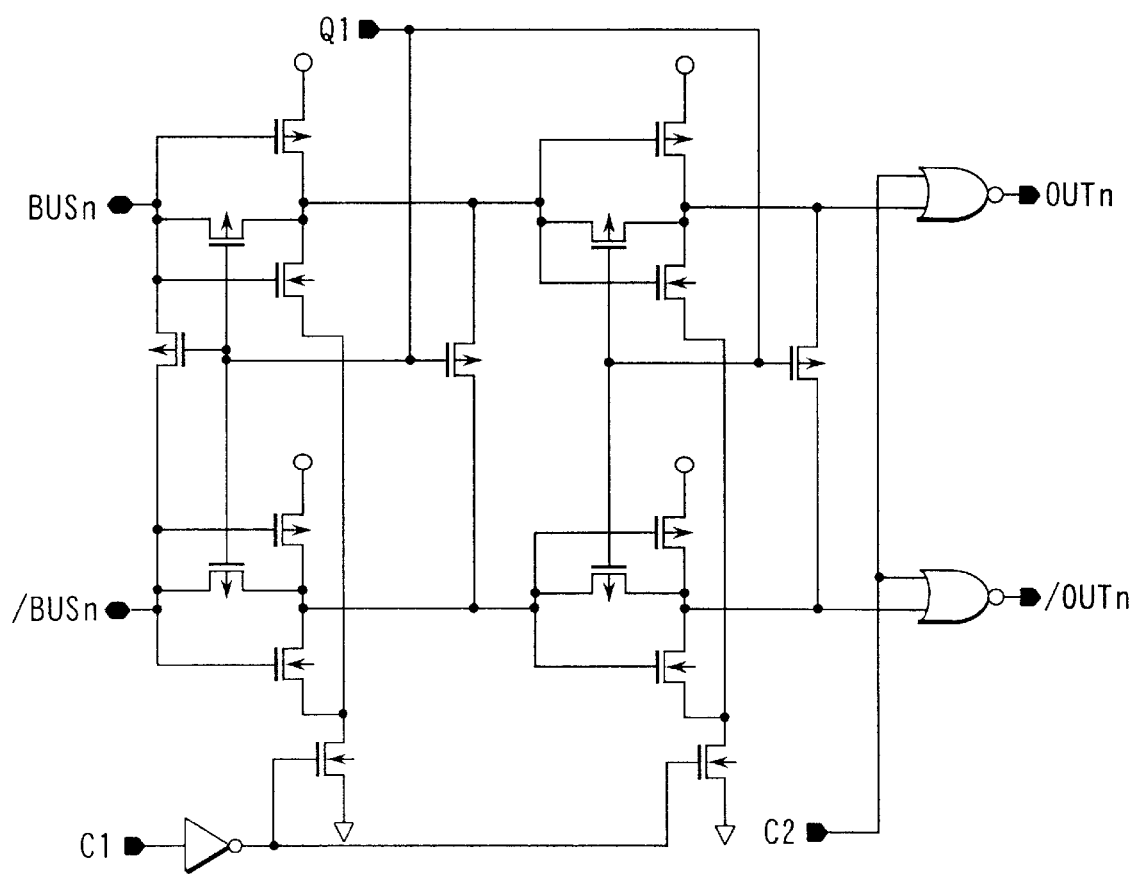
FIG. 12 is a circuit diagram showing an example of a data output circuit composition of the chip.

FIG. 12 shows an example of the data output circuit to constitute the data input/output circuit groups 18a and 18b.

This circuit is controlled by the pulse signal Q1 control signals C1 and C2. That is, this circuit amplifies the signal (BUSn, /BUSn) in bus line 24 and output the amplified signal (OUTn, /OUTn) to data output buffer 23. Note that n represents the number of IO pads 21.

Figure 13:
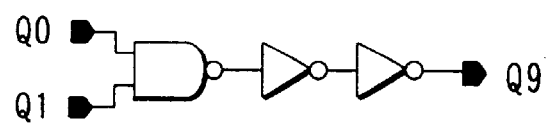
FIG. 13 is a circuit diagram showing an example of the pulse synthesizing circuit composition of the chip.

FIG. 13 shows an example of a pulse synthesizing circuit to constitute the pulse synthesizing circuit/control pin input circuit 19.

This circuit is designed to output the pulse signals (Q0, Q1), which are generated with the change of each address, as a pulse signal (Q9).

Figure 14:
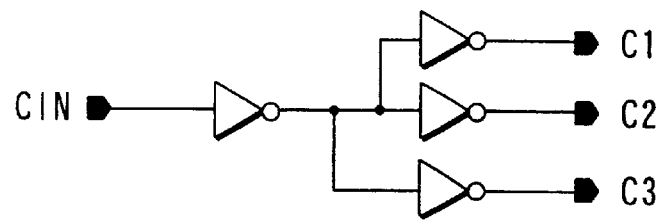
FIG. 14 is a circuit diagram showing an example of a control pin input circuit composition of the chip.

FIG. 14 is an example of a control pin input circuit to constitute the pulse synthesizing circuit/control pin input circuit 19.

This circuit is designed to generate a plurality of control signals (C1, C2, C3) from the signal (CIN) inputted from a control pin (not shown).

Figure 15A:
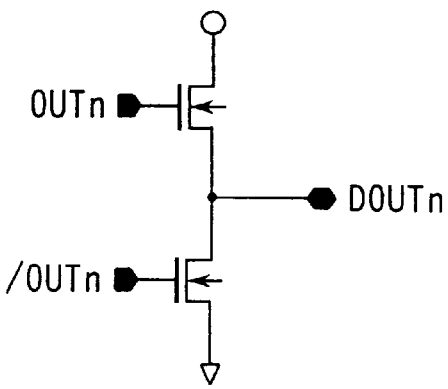
FIGS. 15A and 15B are circuit diagrams showing examples of data output buffer compositions of the chip, respectively.
Figure 15B:
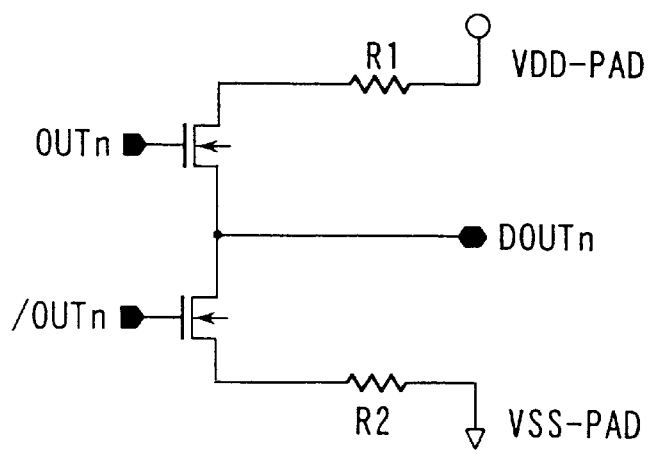

FIGS. 15A and 15B show examples of the data output buffers 23. FIG. 15A shows an example of the composition of a basic data output buffer, while FIG. 15B shows an example to which the wiring resistance of power source line is added.

This circuit is designed to output the signal (OUTn, /OUTn), which is output from the data output circuits of the data input/output circuit groups 18a and 18b, to the IO pads 21 as the data (DOUTn). Note that R1 is the wiring resistance of VDD power source line and R2, the wiring resistance of VSS power source line.

According to the chip layout of the memory cell chip 10, all the predecoders and all the address input circuits are provided in the peripheral circuit area 15a. Further, the predecoder groups 16a and 16b and the address input circuit groups 17a and 17b are substantially equally distributed on the left side and the right side of the middle point of the center line of the peripheral circuit area 15a. By arranging in this way the distance from the address input circuit to the predecoder and the distance from the predecoder to the row decoder or the column decoder can be reduced to a minimum.

Figure 16:
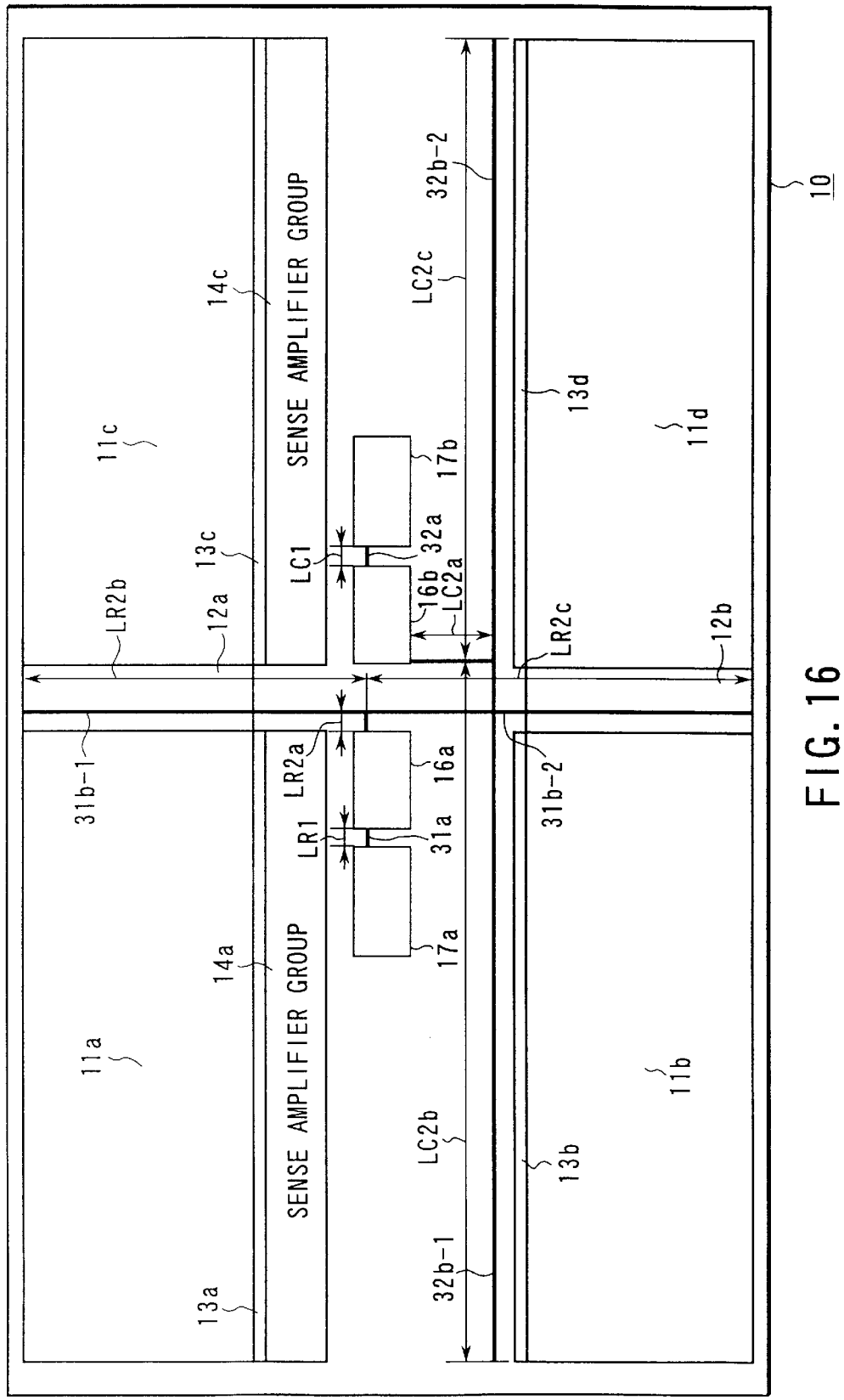
FIG. 16 is a schematic diagram showing an example of wiring connecting a predecoder group and an address input circuit group of the chip.

FIG. 16 shows an example of wiring for the chip 10, especially wiring 31a connecting the predecoder group 16a and the address input circuit group 17a and wiring 32a connecting the predecoder group 16b and address input circuit group 17b. Further, the figure also shows wirings 31b-1, 31b-2, 32b-1 and 32b-2 ranging from the row address input circuit and column address input circuit to the row decoder and column decoder by way of the predecoder.

In the case of this layout, concerning the row address, wiring 31a (LR1) between the address input circuit group 17a and the predecoder group 16a is very short. Further, the lengths (LR2a+LR2b and LR2a+LR2c) of wirings 31b-1 and 31b-2 respectively connecting the predecoder group 16a and the row decoder groups 12a and 12b are about a half of the short side of the chip 10 respectively.

Similarly, concerning the column address, the length (LC1) of wiring 32a between the address input circuit group 17b and the predecoder group 16b is very short. Further, the lengths (LC2a+LC2b and LC2a+LC2c) of wirings 32b-1 and 32b-2 respectively connecting the predecoder group 16b and the column decoder groups 13b and 13d are about a half of the long side of the chip 10 respectively.

Figure 1:
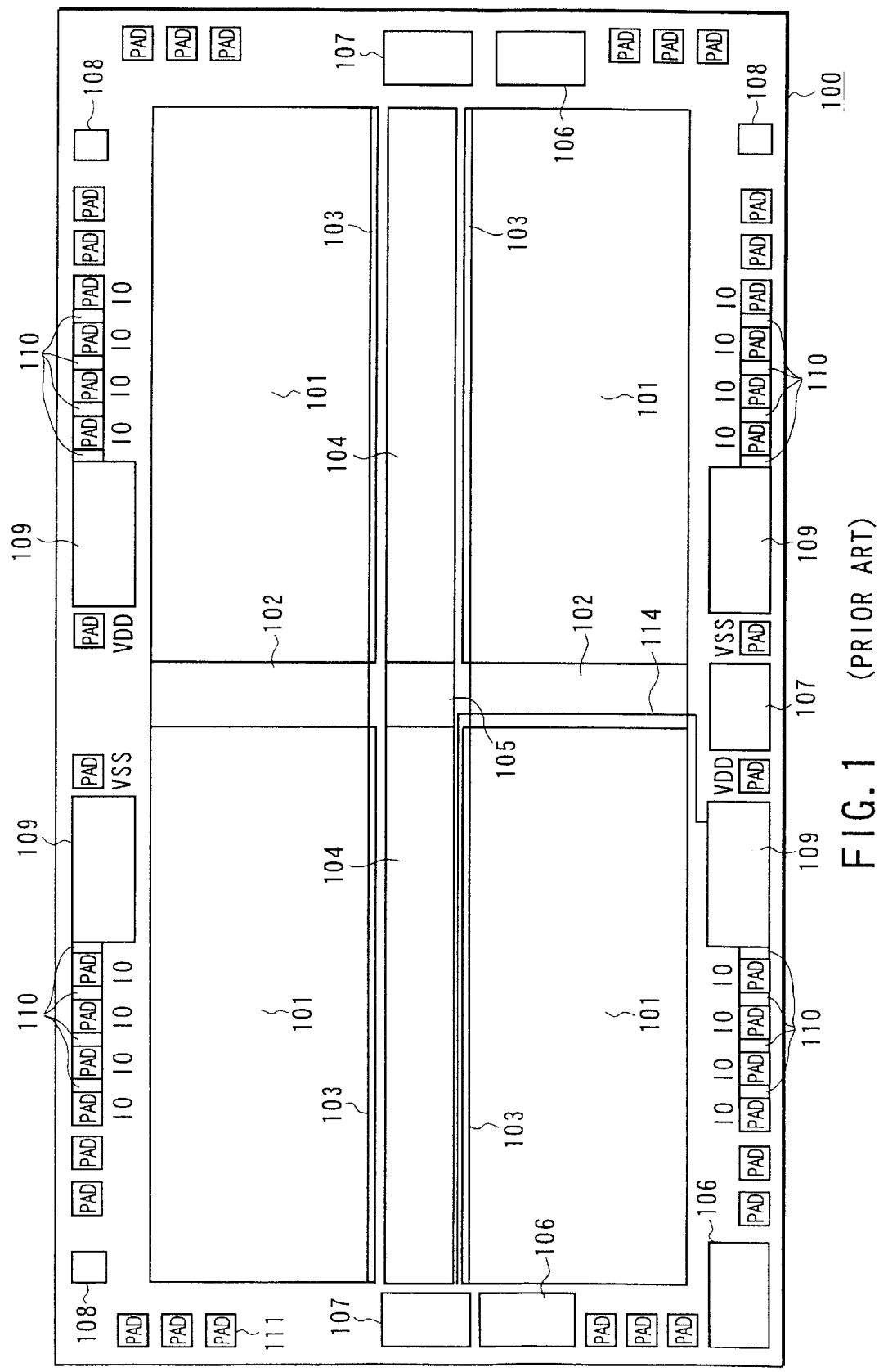
FIG. 1 is a plan schematically illustrating a memory cell chip according to the prior art and its problems.
Figure 2:
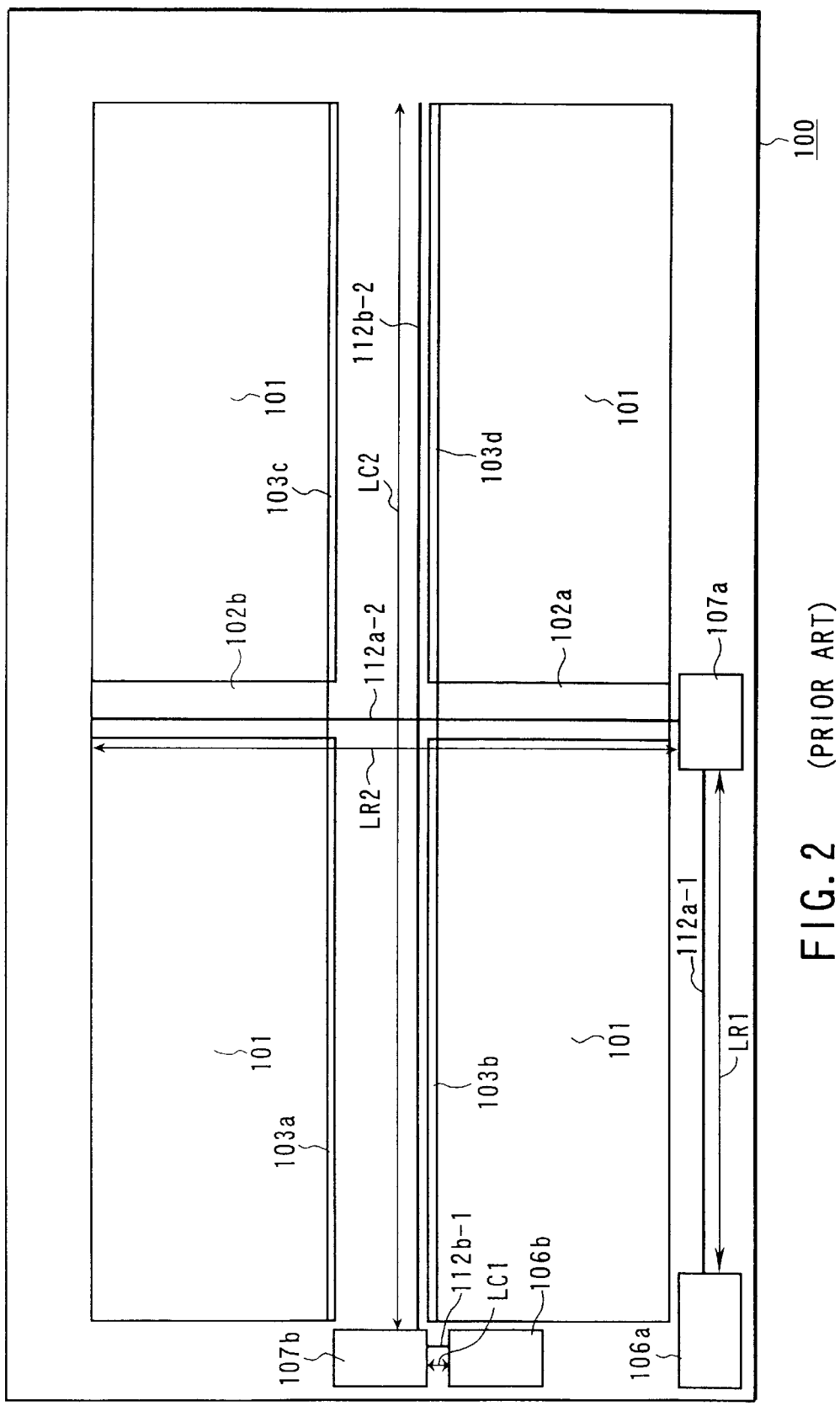
FIG. 2 is a schematic diagram showing an example of wiring connecting predecoder groups and an address input circuit group in a conventional chip.

In this way, wirings according to the present invention can be reduced markedly compared with the conventional case (Refer to FIG. 2). Therefore, the influence of the wiring capacity and the wiring resistance on the output signal of the address input circuit and the output signal of the predecoder can be reduced to make the output waveforms steeper. Consequently, the time required for the establishment of the predecoder from the change of the address can be reduced for higher access speed.

Further, in the case of the chip layout according to the present embodiment (Refer to FIG. 5), the pulse synthesizing circuit/control pin input circuit 19 is provided substantially at the center of the pad area 15b. By doing so, the distances from all the address input circuits to the pulse synthesizing circuit can be reduced a minimum.

Figure 17:
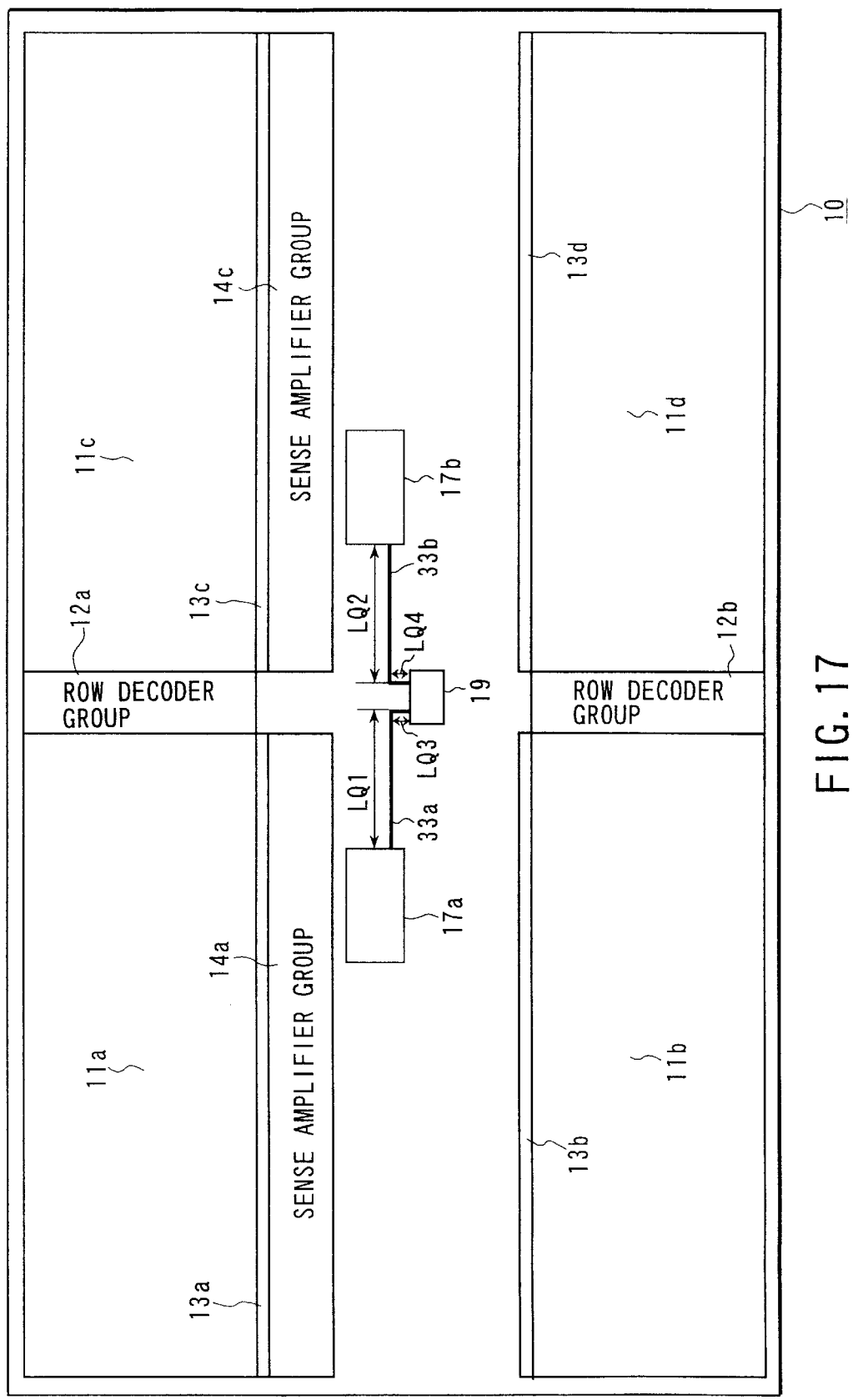
FIG. 17 is a schematic diagram showing an example of wiring connecting an address input circuit group and a pulse synthesizing circuit/control pin input circuit of the chip.

FIG. 17 shows an example of wiring for the chip 10, especially wirings 33a and 33b respectively connecting between the address input circuit groups 17a and 17b and the pulse synthesizing circuit/control pin input circuit 19.

The lengths (LQ1+LQ3, LQ2+LQ4) of wirings 33a and 33b between the address input circuit group 17a and the pulse synthesizing circuit control pin input circuit 19 and between the address input circuit group 17b and the same are markedly shorter than a half of the long side of the chip 10.

Figure 3:
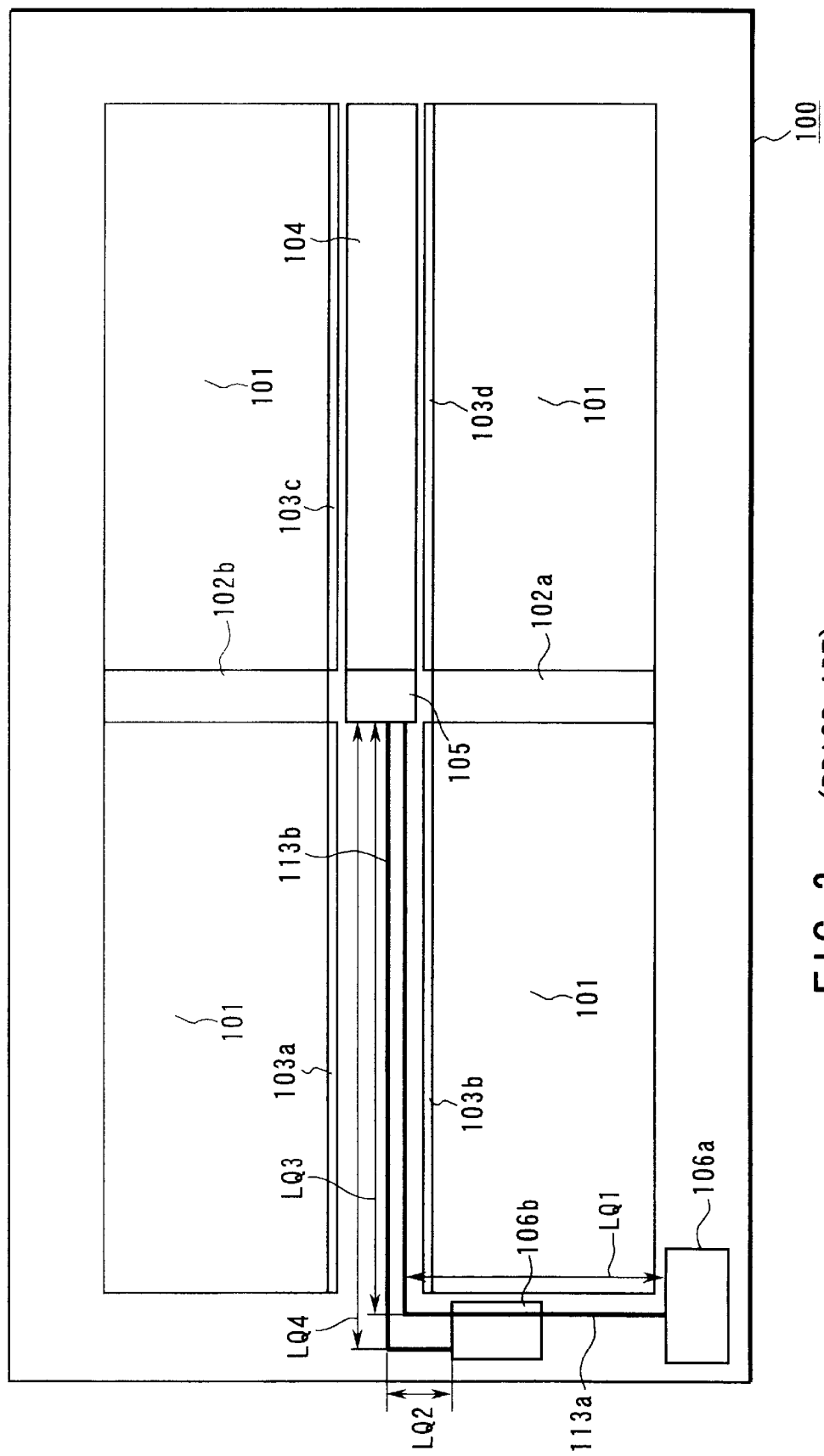
FIG. 3 is a schematic diagram showing an example of wiring connecting the address input circuit groups and a pulse synthesizing circuit in a conventional chip.

In this way, in the case of the present invention, the length of wiring can be reduced markedly compared with the conventional case (Refer to FIG. 3). Therefore, the wiring capacity and wiring resistance of wiring 33a and 33b connecting all the address input circuits and pulse synthesizing circuit can be reduced for speeding the pulse synthesizing signal generation. Consequently, the pulse synthesizing signal can be generated in a shorter period of time for higher access speed.

Further, in the case of the chip layout according to the present embodiment (Refer to FIG. 5), the data input/output circuit group 18a is provided on the outside of the address input circuit group 17a and substantially at the center each of the upper and lower cell blocks 11a and 11b and the data input/output circuit group 18b is provided on the outside of the address input circuit group 17b and substantially at the center each of the upper and lower cell blocks 11c and 11d. By doing so, the distance from the sense amplifier to the data output circuit and the distance from the data output circuit to each of the data output buffers 23a and 23b can be reduced to a minimum.

Figure 18:
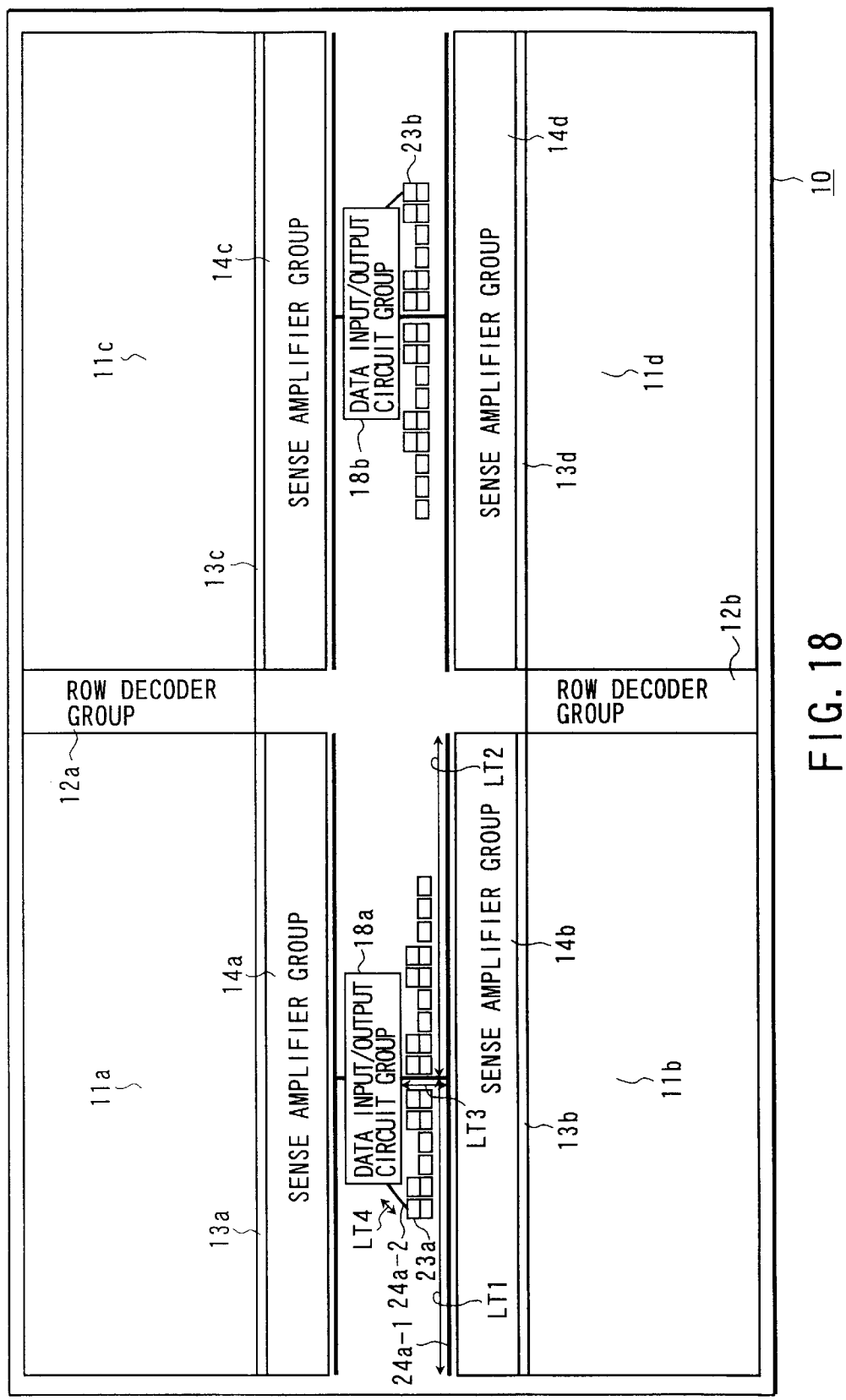
FIG. 18 is a schematic diagram showing an example of a bus line connecting a sense amplifier group and a data input/output circuit group of the chip.

FIG. 18 shows an example of a wiring (bus line) for the chip 10, especially bus line 24a-1 connecting each of the sense amplifier groups 14a and 14b and the data input/output circuit group 18a.

The length (LT1+LT2+LT3) of bus line 24a-1 from the sense amplifier group 14b to the data input/output circuit group 18a is a half of the long side of the chip 10.

Similarly, the length (LT4) of bus line 24a-2 from the data input/output circuit group 18a to the data output buffer 23a can also be reduced largely.

Figure 4:
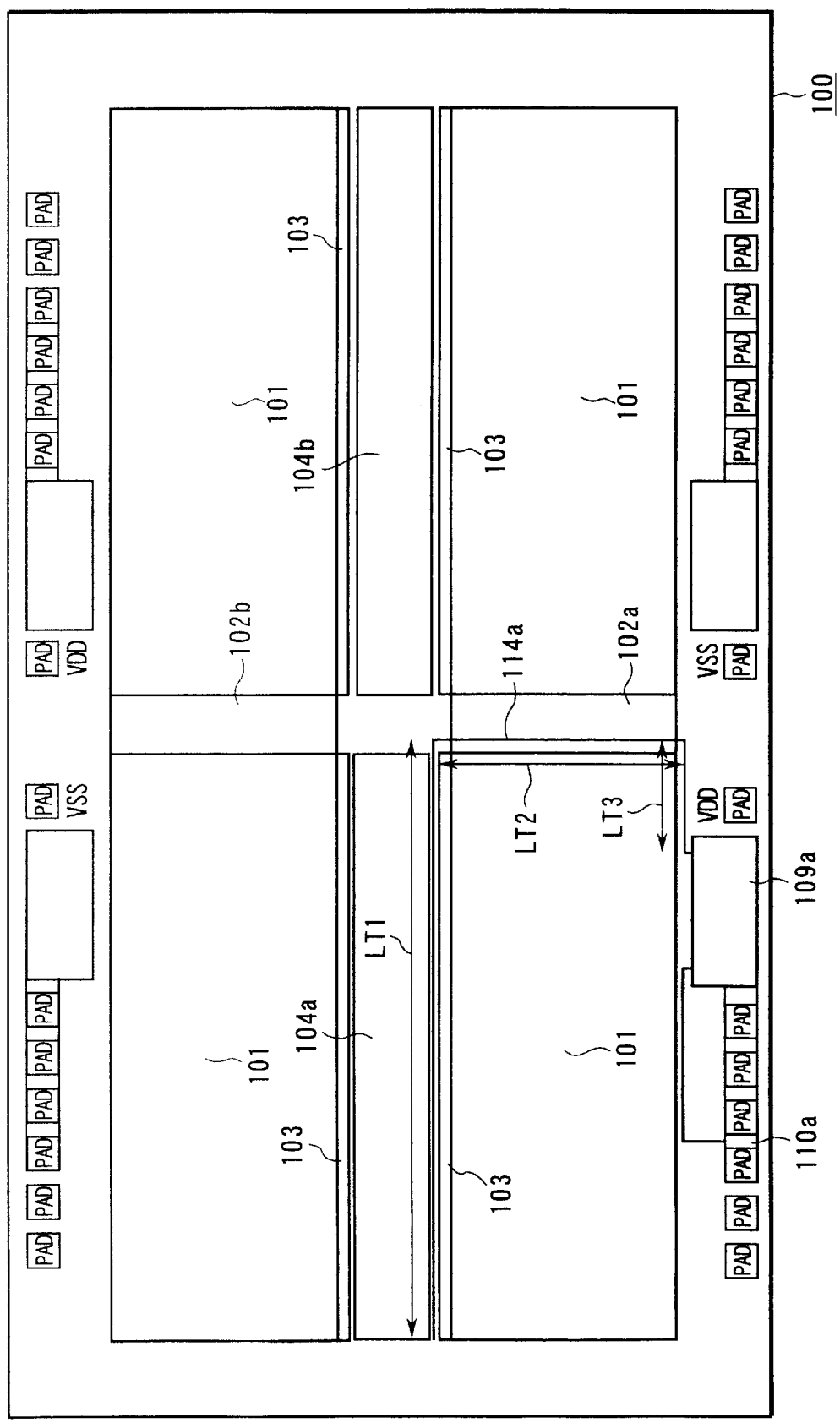
FIG. 4 is a schematic diagram showing an example of bus line connecting a sense amplifier group and a data input/output circuit group in a conventional chip.

In this way, in the case of the present invention, the length of bus line can be reduced largely compared with the conventional case (Refer to FIG. 4). Therefore, the wiring capacities and wiring resistances of bus lines 24a-1 and 24a-2 covering from the sense amplifier group 14b to the data output buffer 23a by way of the data input/output circuit group 18a are reduced to low levels to make the activation of bus lines 24a-1 and 24a-2 much more steep. As a result, the signal can be transmitted to the data output circuit and data output buffer 23a at a higher speed for realizing a higher access speed.

Though the explanation is omitted here, the same rule applies to bus lines connecting the sense amplifier groups 14c and 14d and the data input/output circuit group 18b.

Further, as shown in FIG. 5, in the case of the chip layout according to the present embodiment, the power source pads 22 for VSS and VDD are disposed between IO pads 21. By doing so, the distance from the power source pads 22 to the data output buffer 23 can be reduced largely. Thus, the insufficient steepness of the output waveform due to the wiring resistance of the power source line can be prevented for a higher access speed.

As discussed in the foregoing, according to the chip layout of the present embodiment, the decline of the access speed due to the increase in the capacity of the high-speed memory cell chip 10 can be improved.

Further, an embodiment of the present invention described in the foregoing is concerned with a case where the cell array is divided into four blocks, the first two being arranged side by side and another two being arranged side by side but under the first two, but the present invention is not limited to this case. For example the cell array may be divided into more than four blocks.

Further, the row decoder groups may be provided between the upper cell block and lower cell block, and the peripheral circuit area and pad area may be provided between the cell block on the left side and the cell block on the right side respectively.

Further, other variations of the present invention can be made available within the scope of the subject matter of the present invention.

As described above in detail, according to the present invention, the length of wiring can be reduced largely for providing a semiconductor memory device capable of operating with a higher access speed than those of the conventional device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a cell array having a plurality of block areas arranged in rows and columns:
      row decoder groups, each group provided between two adjacent block areas of one row;
      column decoder groups, every two groups provided between two adjacent block areas of one column;
      sense amplifier groups, every two groups provided between two adjacent block areas of one column;
      peripheral circuit area, provided between two adjacent block areas of columns;
      predecoder groups, each group provided in said peripheral circuit area and located away from a center of the cell array; and
      address input circuit groups, each group provided in said peripheral circuit area and located near said predecoder groups.

2. The semiconductor memory device according to the claim 1, wherein said predecoder groups and said address input circuit groups are arranged in line.

3. The semiconductor memory device according to the claim 1, wherein said predecoder groups and said address input circuit groups are respectively arranged symmetrically with respect to the center of said cell array.

4. The semiconductor memory device according to the claim 1, wherein said address input circuit groups are respectively arranged on the outside of said predecoder groups.

5. The semiconductor memory device according to claim 1, further comprising data input/output circuit groups, each group being provided in said peripheral circuit area and located substantially at a center of each of the block areas in the rows.

6. The semiconductor memory device according to claim 1, further comprising a pad area provided between two adjacent block areas in columns and consisting of a plurality of pads arranged substantially in a line.

7. The semiconductor memory device according to the claim 6, wherein said plurality of pads include address pads, input/output pads and power source pads.

8. The semiconductor memory device according to the claim 7, wherein said power source pads are arranged between said input/output pads.

9. The semiconductor memory device according to the claim 7, wherein data output buffers are arranged in proximity to said input/output pads.

10. The semiconductor memory device according to the claim 1, wherein pulse synthesizing circuit is provided substantially at the center of the cell array.

11. The semiconductor memory device of claim 2, wherein said predecoder groups and said address input circuit groups are respectively arranged symmetrically with respect to the center of said cell array.

12. The semiconductor memory device of claim 2, wherein said address input circuit groups are respectively arranged on the outside of said predecoder groups.

13. The semiconductor memory device of claim 3, wherein said address input circuit groups are respectively arranged on the outside of said predecoder groups.

14. The semiconductor memory device of claim 2, further comprising:
   data input/output circuit groups, each group being provided in said peripheral circuit area and located substantially at a center of each of the block areas in the rows.

15. The semiconductor memory device of claim 3, further comprising:
   data input/output circuit groups, each group being provided in said peripheral circuit area and located substantially at a center of each of the block areas in the rows.

16. The semiconductor memory device of claim 4, further comprising:
   data input/output circuit groups, each group being provided in said peripheral circuit area and located substantially at a center of each of the block areas in the rows.

17. The semiconductor memory device of claim 2, wherein a pulse synthesizing circuit is provided substantially at the center of the cell array.

18. The semiconductor memory device of claim 3, wherein a pulse synthesizing circuit is provided substantially at the center of the cell array.

19. The semiconductor memory device of claim 4, wherein a pulse synthesizing circuit is provided substantially at the center of the cell array.

20. The semiconductor memory device of claim 5, wherein a pulse synthesizing circuit is provided substantially at the center of the cell array.

* * * * *